United States Patent
Hwang et al.

[11] Patent Number: 5,901,304
[45] Date of Patent: May 4, 1999

[54] EMULATING QUASI-SYNCHRONOUS DRAM WITH ASYNCHRONOUS DRAM

[75] Inventors: Wei Hwang, Armonk; Rajiv Vasant Joshi, Yorktown Heights, both of N.Y.; Yasunao Katayama, Kanagawa, Japan

[73] Assignee: International Business Machines Corporation, Armonk, N.Y.

[21] Appl. No.: 08/816,600

[22] Filed: Mar. 13, 1997

[51] Int. Cl.⁶ .................................................. G06F 5/06
[52] U.S. Cl. ........................... 395/500; 365/233; 711/105
[58] Field of Search .................................... 711/104, 105; 395/500; 365/233

[56] References Cited

U.S. PATENT DOCUMENTS

| | | | |
|---|---|---|---|
| 4,665,495 | 5/1987 | Thaden | 345/507 |
| 4,922,432 | 5/1990 | Kobayashi et al. | 364/490 |
| 5,033,027 | 7/1991 | Amin | 365/233 X |
| 5,148,524 | 9/1992 | Harlin et al. | 345/519 |
| 5,258,919 | 11/1993 | Yamanouchi et al. | 364/489 |
| 5,276,843 | 1/1994 | Tillinghast et al. | 395/500 X |
| 5,291,580 | 3/1994 | Bowden, III et al. | 711/5 |
| 5,404,338 | 4/1995 | Murai et al. | 365/233 |
| 5,432,707 | 7/1995 | Leung | 364/489 |

*Primary Examiner*—David L. Robertson
*Attorney, Agent, or Firm*—Whitham, Curtis & Whitham; Robert P. Tassinari, Esq.

[57] ABSTRACT

A quasi-synchronous DRAM circuit uses a plurality of asynchronous DRAM macros organized in memory banks. An interface conversion circuit receives external synchronous control signals and generates internal control signals for each of the plurality of asynchronous DRAM macros. A data buffer circuit is connected to each of the asynchronous DRAM macros by in internal input/output (I/O) bus. The interface conversion circuit controls the data buffer to provide synchronous burst of data through frequency conversion.

10 Claims, 7 Drawing Sheets

SYNCHRONOUS OR
ASYNCHRONOUS INTERFACE DEPENDING
ON THE CLOCK FREQUENCY

EMULATING QUASI-SYNCHRONOUS DRAM WITH ASYNCHRONOUS DRAM

BACKGROUND OF THE INVENTION

1. Field of the Invention

The present invention generally relates to dynamic random access memories (DRAMs), embedded DRAMs and computer memory systems and, more particularly, to DRAMs where high-speed synchronous data transfer is required.

2. Background Description

Recently, many kinds of high-speed DRAMs, such as synchronous DRAM (SDRAM), are being used in computer systems. This is because the rapid increase in central processor unit (CPU) performance (about 70% annually) requires much faster instruction and data streams transferred between the CPU and DRAMs, while the access time for the conventional fast page mode DRAMs has not been improved much. However, an ever increasing number of new kinds of DRAMs require enormous design effort since, for example, existing SDRAMs require a totally new design almost from scratch in order to achieve high data rates. In addition, various application needs, such as a wide input/output (I/O) data path, increase the design effort even more. Another problem related to existing SDRAMs is that the clock distribution over the chip in SDRAMs is a considerable source of power consumption. Moreover, existing SDRAMs exhibit very slow performance if the clock frequency is low. This situation often occurs in low-end embedded applications.

FIGS. 1A and 1B show timing diagrams for existing asynchronous and synchronous DRAM interfaces, respectively, in 4-bit burst read operations. In an asynchronous interface, the high-to-low transitions of the RAS (row address strobe) and CAS (column address strobe) signals, respectively latch the multiplexed row and column addresses and start the row and column access operations. The CAS operations need to be repeated four times to get four bits of data out. The low-to-high transitions start pre-charging operations of the row and column circuitry. On the other hand, the SDRAM, which is disclosed in U.S. Pat. No. 5,404,338 operates in synchronization with clock signals to function as a main storage for high speed CPUs and graphics accelerators.

FIG. 1B shows typical access cycles in the SDRAM in the JEDEC (Joint Electron Device Engineering Council) standard synchronous interface. The row and column address strobes and accesses start by setting the RAS and CAS signals to low at the rising edge of the clock, occur in clocks numbers 1 and 3, respectively. In the 4-bit burst mode operations, the succeeding column addresses are generated internally in linear or interleaved manner. The data output starts after a pre-determined clock cycle (in this case in clock number 5). Precharging the row circuitry starts in clock number 7 when the RAS signal is set to low after the column burst operations finish, while the CAS does not need a pre-charge operation. The RAS and CAS access latencies are limited only a few selections which are defined in the mode register as the integer multiple of the clock cycles. Here, latency means the number of clock cycles from starting the access to the acquisition of the data. This limitation results in narrow coverage of the clock frequencies of the SDRAM. In other words, if the frequency is too high, the memory access operations cannot catch-up to the clock, while if the clock frequency is too low, the memory access operations take much longer time than the DRAM really can provide.

FIG. 2 shows a typical block diagram of existing SDRAM design using a full custom approach down to the transistor level. The memory arrays 1a and 1b are configured in a two-bank architecture. By interleaving the memory access to the two banks, the access latency due to the pre-charge operations of the row circuitry can be minimized. Outputs from the memory arrays 1a and 1b are respectively provided to sense amplifiers 2a and 2b. The memory arrays 1a and 1b are addressed by row decoders 7a and 7b and column decoders 3a and 3b, respectively. The various control circuits, such as sequential control 5a and 5b and row column select 6a and 6b, are supplied with inputs from command decoder 102. Inputs to the command decoder are provided by the write enable (WE) buffer 104, the CAS buffer 105, the RAS buffer 106, and the chip select (CS) buffer 107.

The circuitry on the SDRAM chip is synchronous with a clock (CLK) from clock buffer 109 synchronized by an external clock (CKE) supplied by buffer 110. The clock lines, drawn by thick solid lines, reaches all across the chip, resulting in the larger power consumption for the clock related circuits. This is particularly serious if the pipeline architecture is used for the column circuitry for improved data rate.

Secondly, a high performance synchronous memory system is disclosed in, for example, U.S. Pat. No. 5,291,580, consists of the standard DRAMs, latch and buffer circuits and control circuits implemented in separate chips. However, the system is not designed for a memory system that is logically and physically compatible with existing SDRAM and SDRAM SIMM (single in-line memory module).

Finally, a synchronous DRAM memory module is disclosed in U.S. Pat. No. 5,494,435. However, it is rather a straight forward implementation using synchronous DRAMs with better placement of the clock driver for higher clock rate.

SUMMARY OF THE INVENTION

It is therefore an object of the present invention to provide a way of designing a high-performance and low-power SDRAM-like memory in a much shorter turn around time than in current practice.

It is another object of the invention to provide both synchronous and asynchronous DRAM interfaces for better coverage of clock frequency and to reduce the power consumption related to the clock distribution.

According to the preferred embodiment of the invention:

1. The macro block of the DRAM array and peripheral circuits (we call it a DRAM macro) are used. The interface of the DRAM macro is asynchronous, identical or some variation of the page mode standard DRAMs. The chip has at least two of the DRAM macros in order to emulate the two bank architecture of existing SDRAMs. For further improvement in data transfer rate, multiple bank (more than two) architecture can be used.
2. An interface conversion circuit is used from external synchronous interface to internal asynchronous DRAM macro interface. The conversion circuit controls the different banks independently using separate control signals.
3. A data-buffer circuit pre-fetches the data using an internal wide I/O bus with early pre-charge of the array and synchronously bursts the data from the data-buffer circuit through frequency conversion. The burst transfer is controlled by the interface conversion circuit.

The advantages of the invention are as follows:

1. It can reduce the design turn-around by making the best use of existing standard DRAM design and gate array circuits for the interface conversion circuit and data-buffer circuits. In particular, the use of gate array circuits for the interface conversion circuitry greatly reduces not only the design turn-around time but also the process turn-around time since different types of synchronous DRAMs can be designed with only the back end processing steps.
2. Frequency conversion through the data-buffer circuit can easily increase the data rate up to the bus interface limit without much circuit tuning effort.
3. Independent control of internal RAS and CAS signals, etc., further improve the data rate by interleaving multiple banks in RAS and/or CAS cycles.
4. There is no need to distribute a synchronization clock over the chip and, thus, the power consumption is smaller. This is particularly important compared to the column pipeline architecture of the SDRAMs.
5. The synchronous DRAM can also be used as a standard asynchronous DRAM by disabling the interface conversion and data-buffer circuits.
6. The synchronous to asynchronous interface conversion is better than the opposite way. In other words, realizing high frequency page cycles in the asynchronous DRAM interface using synchronous DRAM macros results in far more complex design in terms of the clock generation and interface conversions.

Another preferred embodiment of the present invention uses, instead of the wide on-chip bus, a high-speed page mode for the transfer. Otherwise, the rest is the same.

The concept of the present invention can be implemented in different ways while keeping the major advantages listed above. First, the concept of the present invention is realized in embedded systems where quasi-synchronous DRAM are embedded along with the CPU core and peripheral circuitry. Second, the present invention can be realized in a SIMM level implementation by placing standard DRAMs on the SIMM and using application specific integrated circuit (ASIC) chip(s) for the interface conversion and data-buffer circuits.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
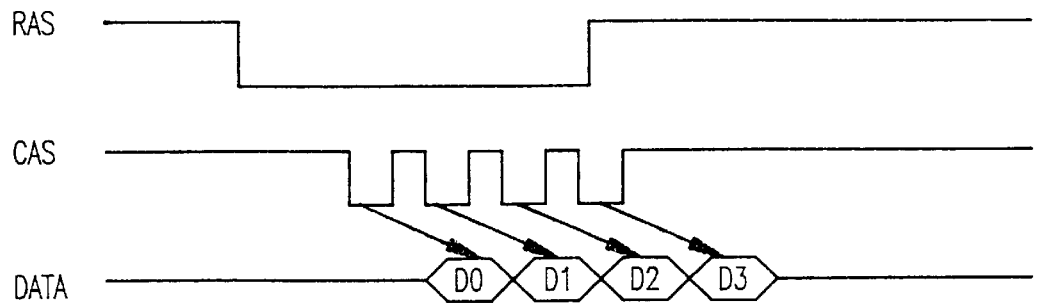
FIGS. 1A and 1B are timing diagrams comparing existing asynchronous and synchronous DRAM interfaces.
Figure 1B:
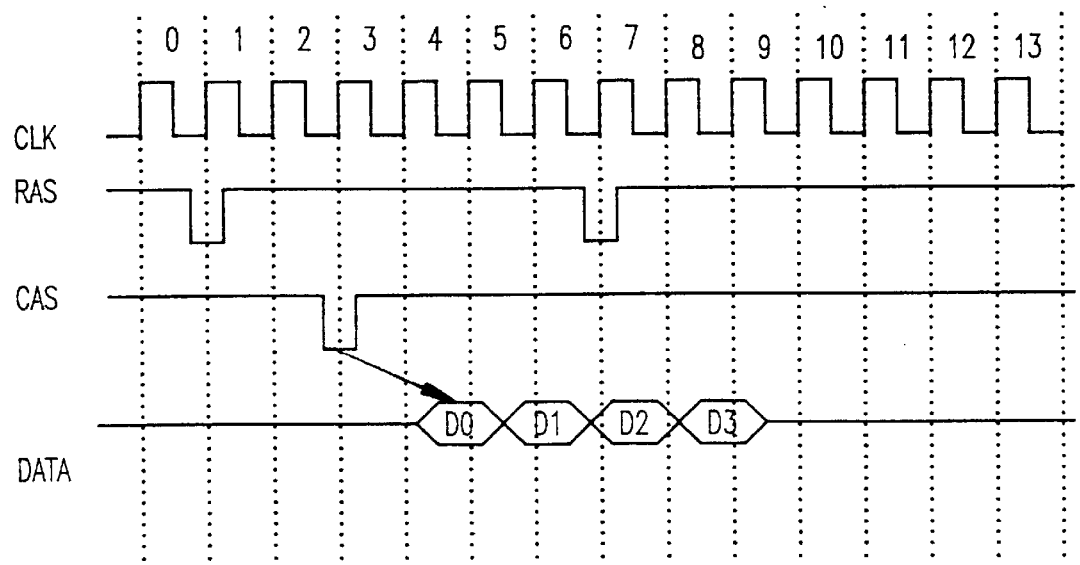
Figure 2:
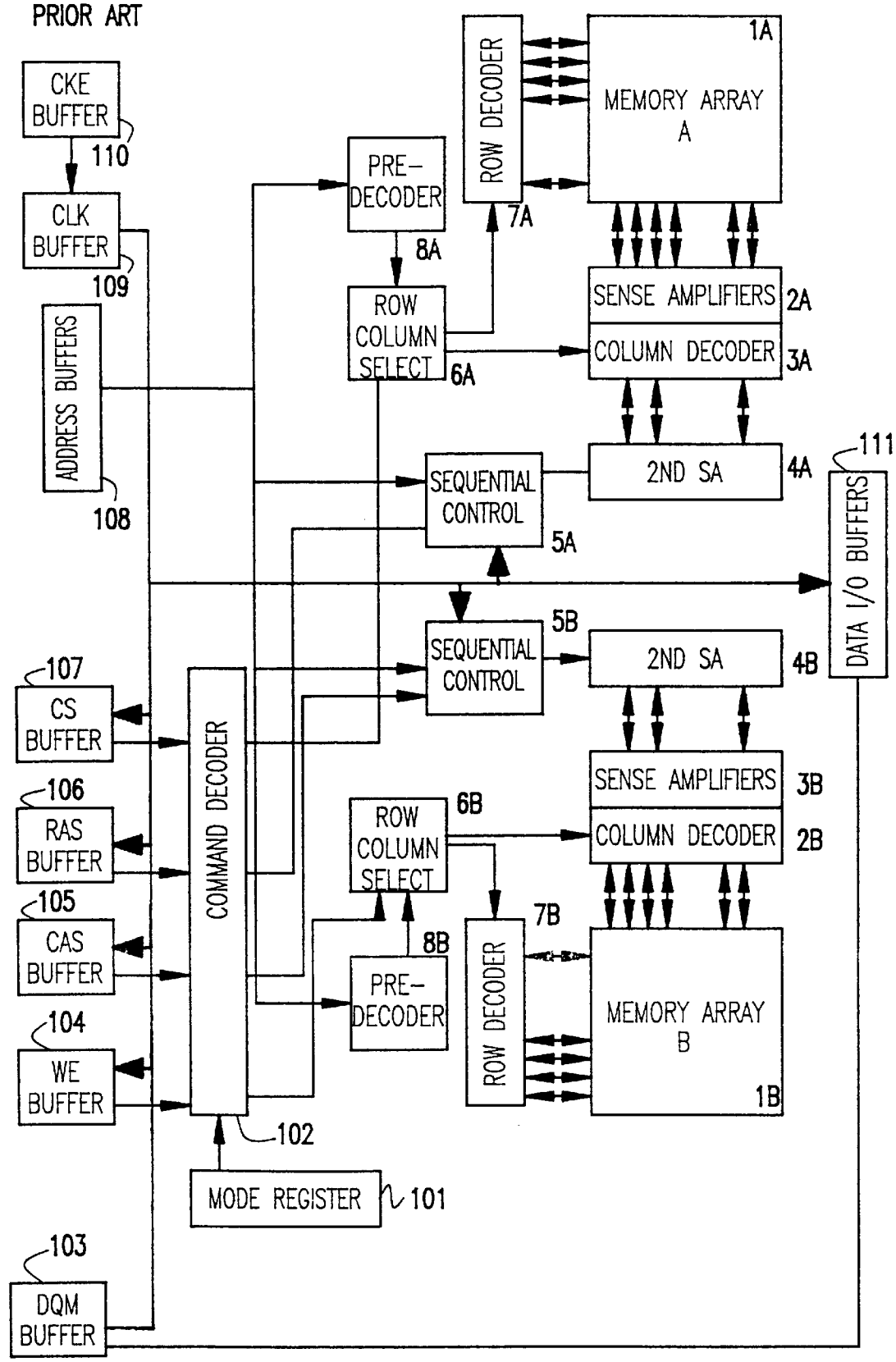
FIG. 2 is a block diagram representing an example of an existing SDRAM design.
Figure 3A:
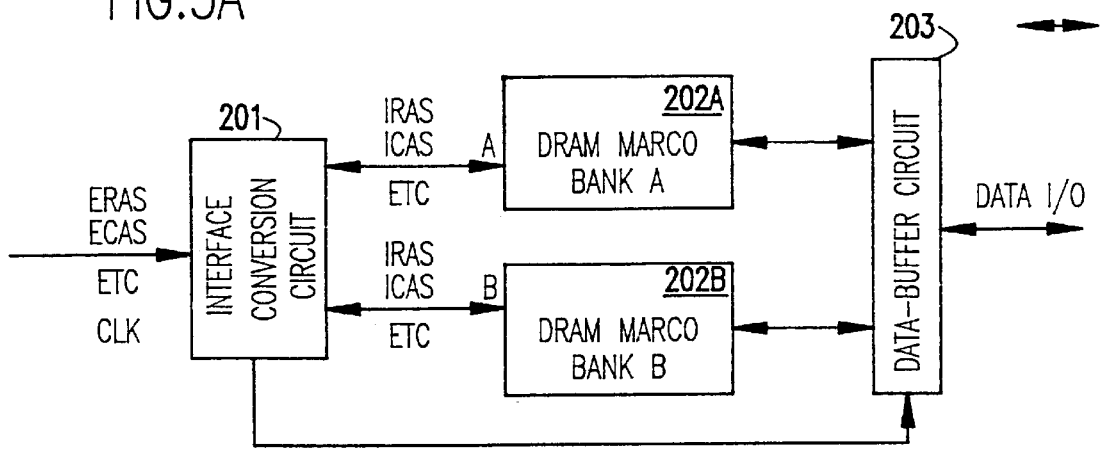
FIGS. 3A and 3B are block diagrams of DRAM chip architectures according to the present invention for two banks and more than two banks, respectively.

Referring again to the drawings, and more particularly to FIG. 3A,. there is shown the basic concept of the DRAM in accordance with the present invention. Two sets of DRAM macros 202a and 202b constitute a two-bank architecture similar to an SDRAM. The interface conversion circuit 201 is responsible for the conversion between the synchronous DRAM interface to the asynchronous DRAM interface. ERAS, ECAS, etc., stand for external RAS, CAS, etc., while IRAS, ICAS, etc., stand for internal RAS, CAS, etc. Control signals other than RAS and CAS are omitted for simplicity of illustration. Note that each bank is controlled by independent IRASa, ICASa, . . . , IRASb, ICASb, . . . , etc., for the emulation of the two-bank architecture of the SDRAM. The data buffer circuit 203 is connected to the DRAM macros with a wide-on-chip bus when only one page cycle is used for the data transfer tot he buffer. Assuming a 4-bit burst, the on-chip bus in each bank needs to be four times as wide as the external I/O bus for efficient 4-bit bust mode. If high-speed multiple pad mode cycles can be used, the width of on-chip buses can be reduced.

Figure 3B:
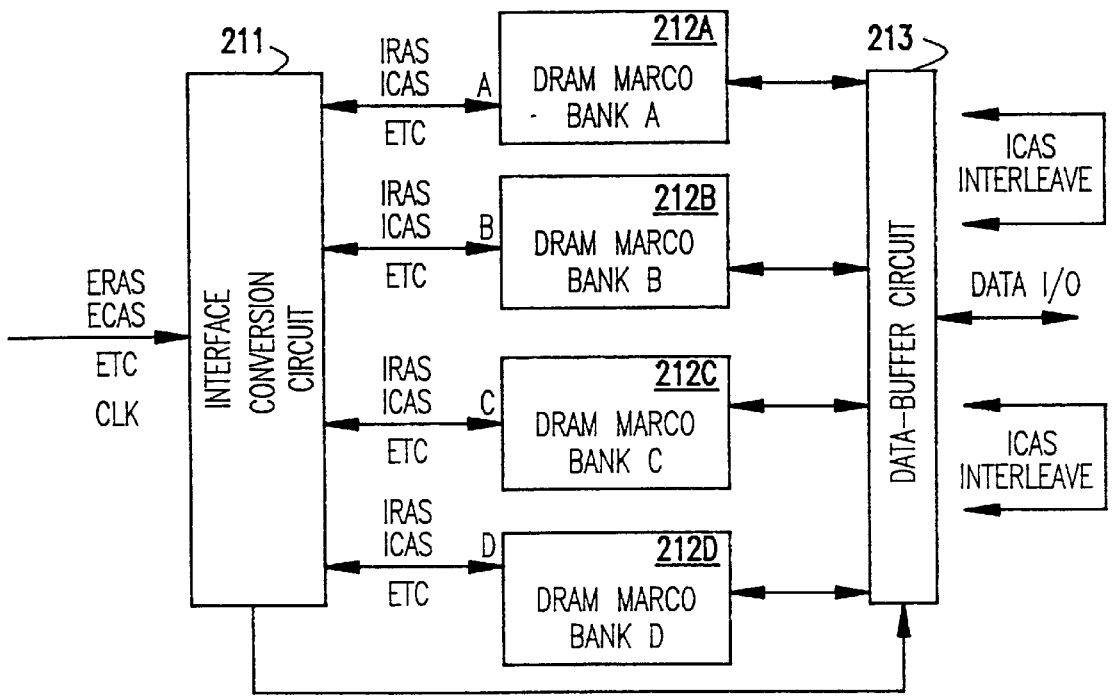

FIG. 3B shows an enhanced architecture of the present invention. Multiple (more than two or $2^n$ where n>1) banks 212a to 212d are used for further data rate improvement. In this case, ICAS from interface conversion circuit 211 is interleaved between bank A and bank B and between bank C and bank D. The present invention contemplates different varieties of interleaving of multiple IRASs and/or ICASs. The data buffer circuit 213 is connected to the DRAM macros with an on-chip bus.

Figure 4A:
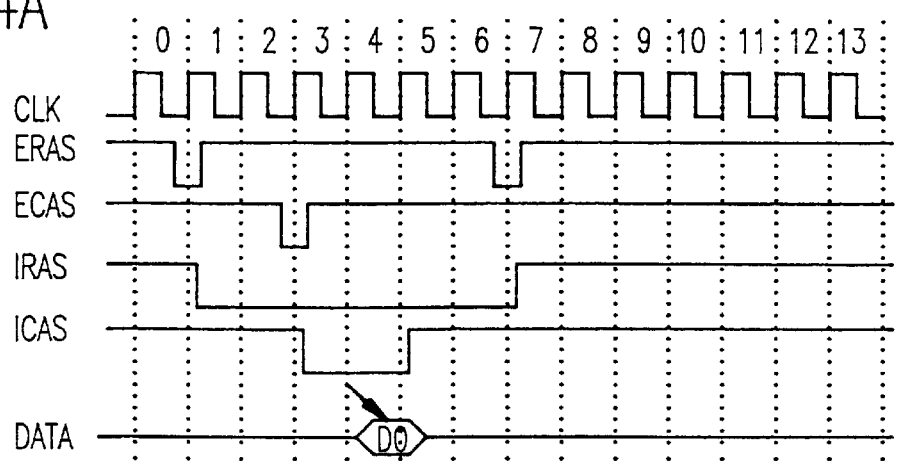
FIGS. 4A, 4B and 4C are timing diagrams of the external and internal signals for single-bit transfer, four-bit transfer using prefetch, and four-bit transfer using fast page mode, respectively.
Figure 4B:
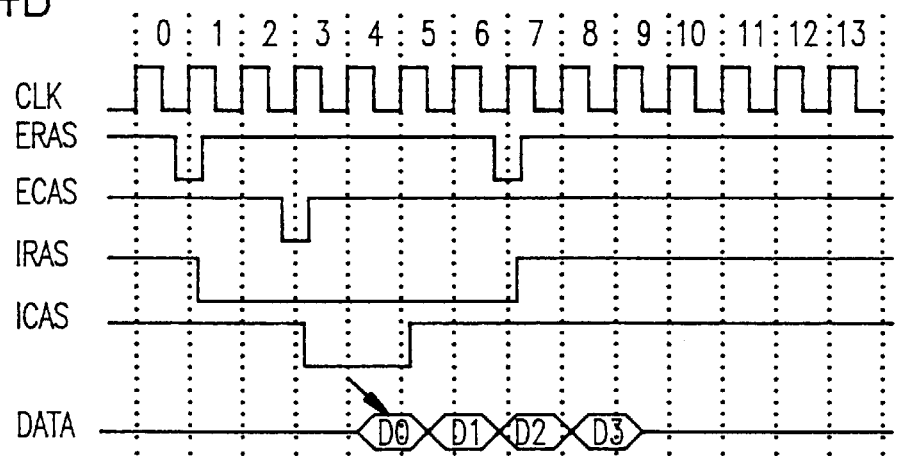
Figure 4C:
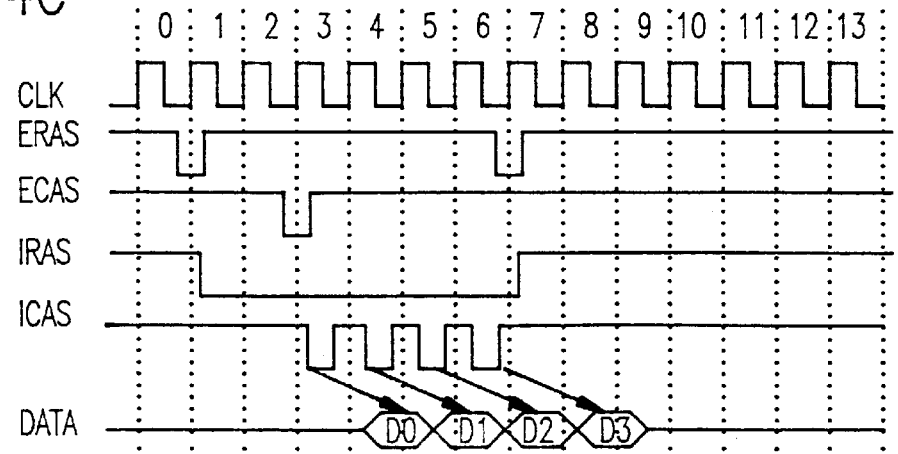

FIG. 4A shows a timing diagram for single-bit transfer, FIG. 4B shows a timing diagram for 4-bit burst transfer using pre-fetch, and FIG. 4C shows a timing diagram for 4-bit burst transfer using multiple fast page mode transfers. Asynchronous internal control signals such as IRAS and ICAS are generated by the interface conversion circuit based on synchronous inputs such as ERAS and ECAS. Only the part of the data latched in the data buffer is transferred in single-bit transfer. In 4-bit transfer, the data is latched in the data buffer circuit.

In FIG. 4B, all of the data in the data buffer circuit is transferred in four clock cycles according to the burst control signal from the interface conversion circuit. This signal also controls the burst sequence such as linear and interleaved burst. The full page burst can also be emulated by a series of 4-bit bursts, although it is not shown in the figure.

Instead of having the wide on-chip data bus, the data transfer between the DRAM macro and data buffer circuit can be done using multiple fast page mode cycles as shown in FIG. 4C. CAS latency and burst mode are configurable by having a register in the interface conversion circuits.

Figure 5:
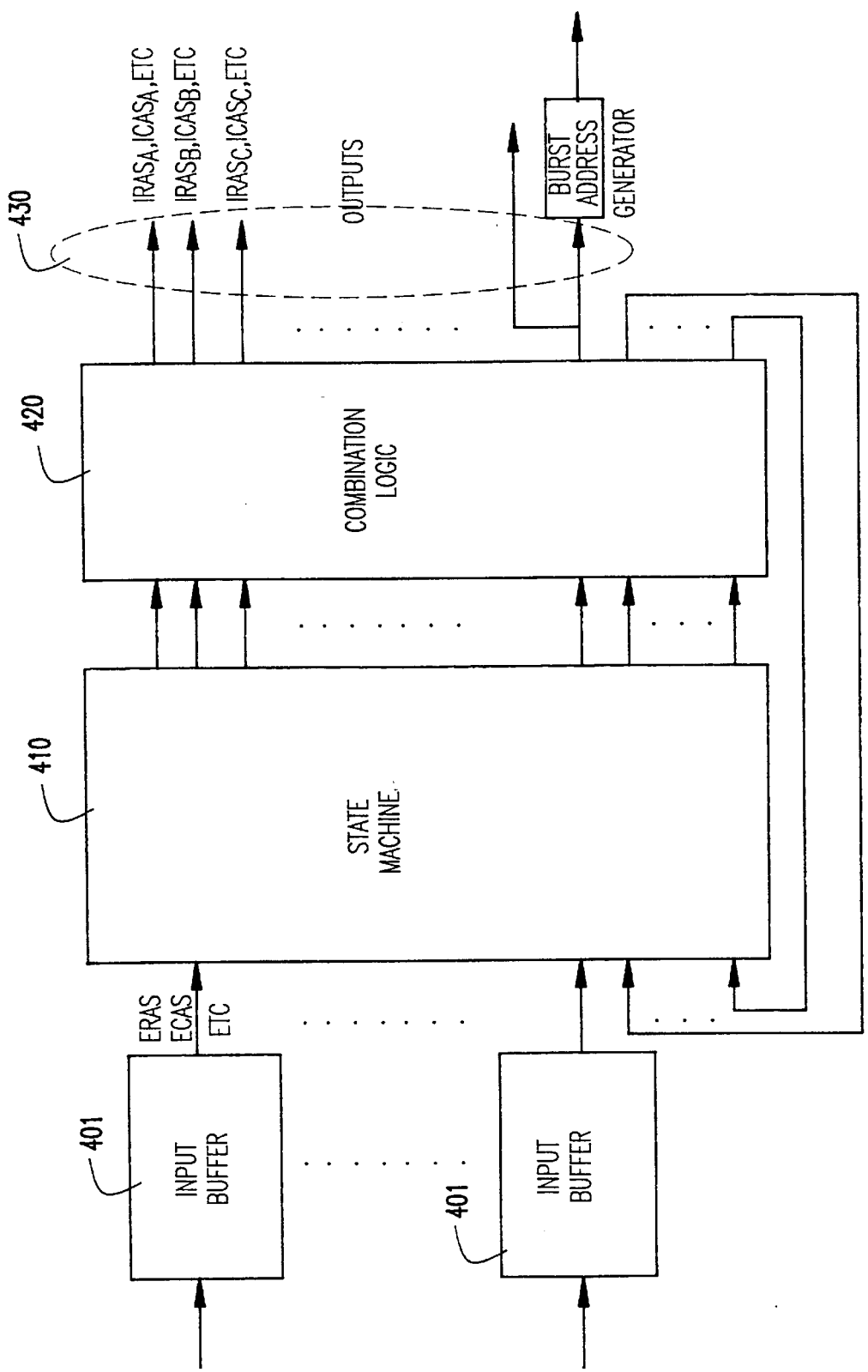
FIG. 5 is a block diagram of the interface conversion circuit for the DRAM chip architectures shown in FIGS. 3A and 3B.

FIG. 5 is a block diagram of the interface conversion circuit 211. The input buffers 401 represent all the input control buffers, such as ERAS, ECAS, EWE (external write enable), ECS (external chip selection), CLK (clock), and ADD (address). All input buffers are synchronous latch circuits. The command decoder consists of a state machine 410 and combination logic 420. The state machine 410 is a gate-array-based design. The combination logic 420 can be synthesized through a hardware description language (HDL). The command decoder receives the external control signals and address from the input buffers 401, converts these signals to internal control signals 430 (i.e., IRASa, ICASa, . . . , IRASb, ICASb, . . . )and burst address generator 440 and burst control signal 441 to select the data I/O buffer circuit.

Figure 6:
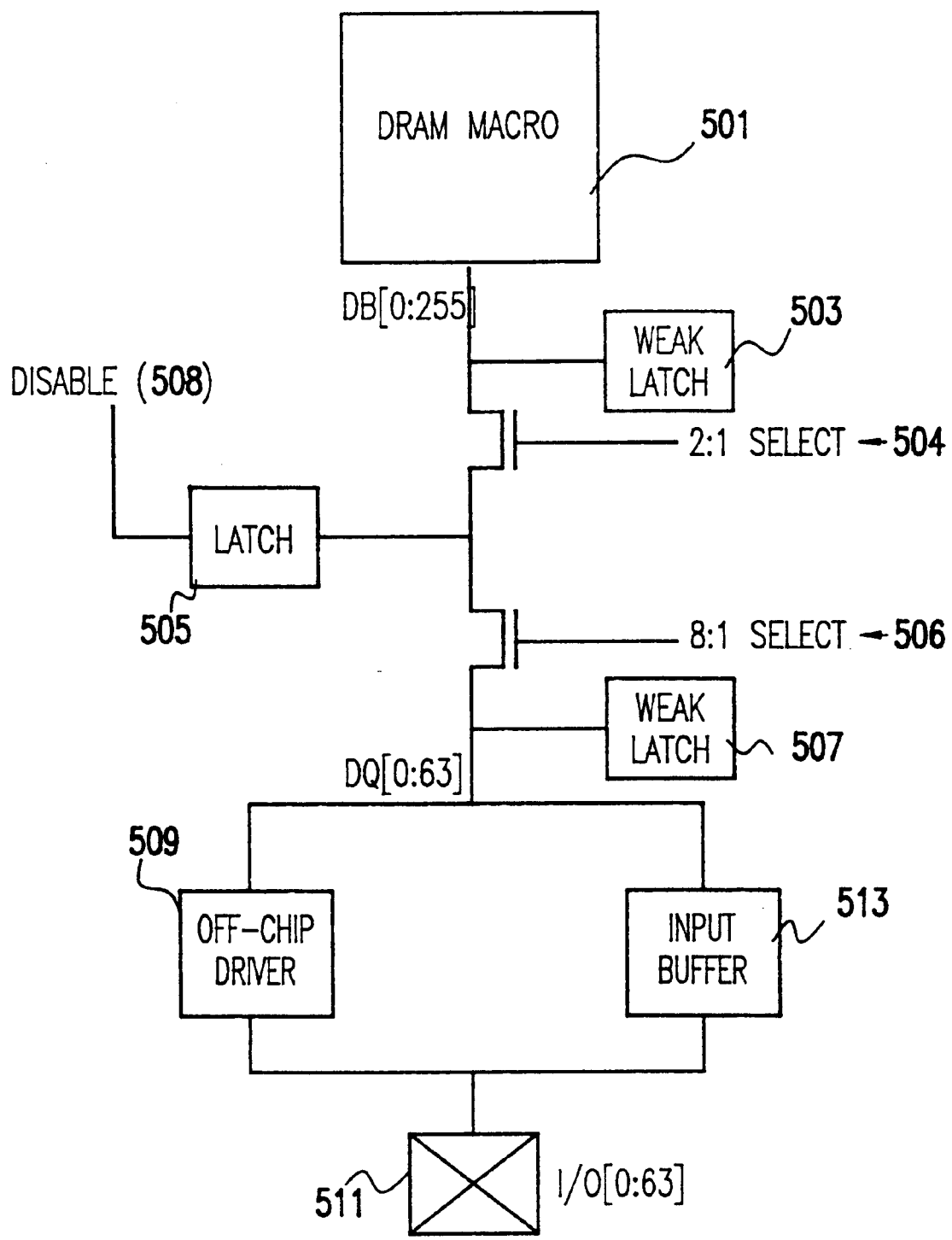
FIG. 6 is a block diagram of the data input/output buffer circuit for the DRAM chip architectures shown in FIGS. 3A and 3B.

FIG. 6 is a block diagram of the data I/O buffer circuits. These are high-speed bidirectional circuits which are designed to minimize the data transfer time between the DRAM macros 501 and the I/O pads 511. The DRAM macros have an internal 256-bit wide data bus denoted DB[0:255]. Each data bus is held by a weak latch 503. Select signals, which come from the interface conversion circuit, control the 2:1 multiplexers 504 and the 8:1 multiplexer 506 and the disable or burst address control 508 which holds at latch 505. The total 64-bit data input/output buses denoted DQ[0:63] are connected. Each data input/output data bus is held by a weak latch 507.

The READ data command will transfer data from the DRAM macro 501 through the off-chip driver 509 to the I/O pads 511. The WRITE data command will input data through the I/O pads 511 to input buffer 513 and distribute to the I/O buses and then to DRAM macros 501.

Figure 7A:
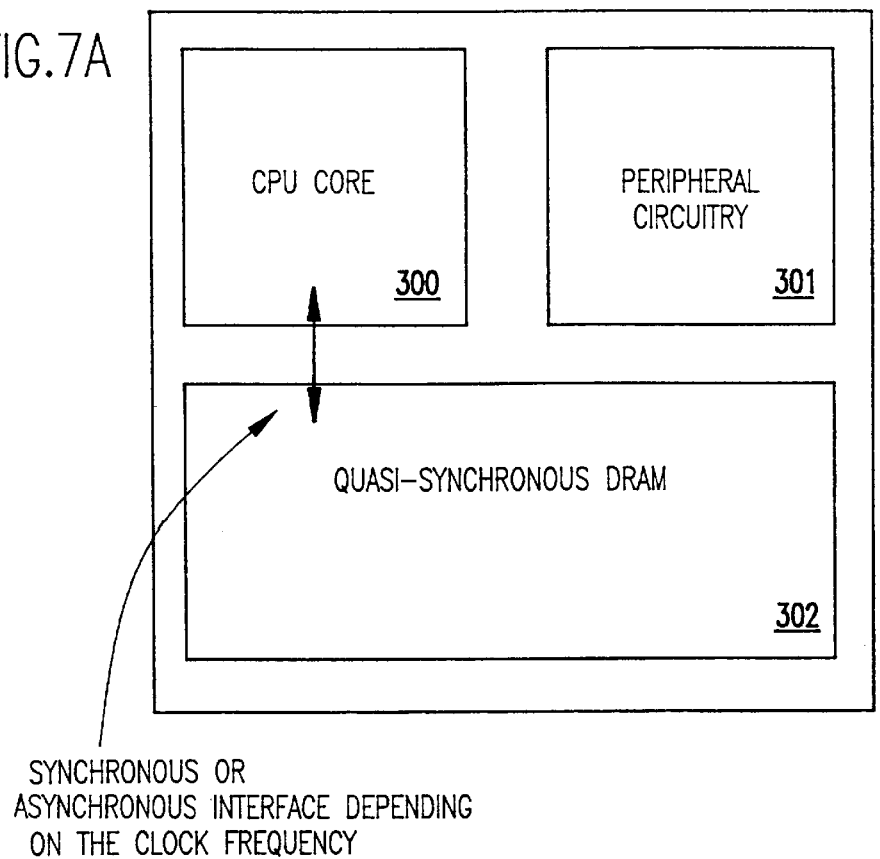
FIGS. 7A and 7 are layout diagrams representing different implementations of the invention for an embedded DRAM chip and a memory-system-level implementation in SIMM, respectively.
Figure 7B:
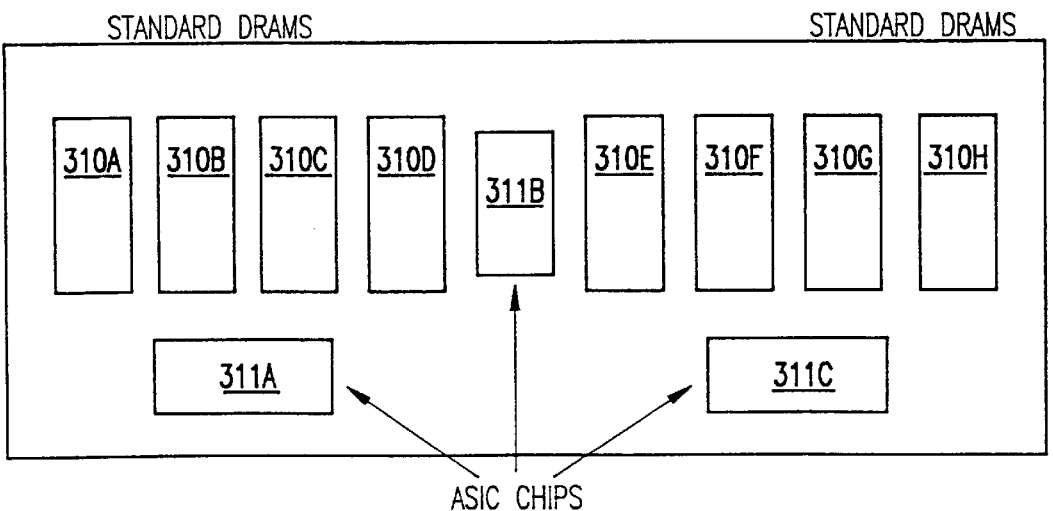

FIGS. 7A and 7B represent different implementations of the present invention. FIG. 7A is for an embedded DRAM chip, while FIG. 7B is for a memory-system level implementation in SIMM (single in-line memory module) using standard DRAMs and separate ASIC (application specific integrated circuit) chip(s).

In FIG. 7A, the CPU core 300 communicates with the quasi-synchronous DRAM 302 according to the invention. See FIGS. 3A and 3B. Other peripheral circuitry 301 is included in this embedded implementation.

FIG. 7B shows the interface conversion circuit and data buffer circuit implemented in a SIMM using wide I/O standard DRAM chips and separate ASIC chips. Although this implementation requires slightly expensive wide I/O DRAMs as well as additional ASIC chip(s), it provides a method of emulating a SDRAM-based SIMM using standard DRAMs. In FIG. 7B the data buffer circuit is implemented in separate chips for the wiring on the printed circuit board (PCB).

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A quasi-synchronous DRAM circuit comprising:

a plurality of asynchronous DRAM macros organized in memory banks;

an interface conversion circuit receiving external synchronous control signals and generating internal control signals for each of the plurality of asynchronous DRAM macros; and a data buffer circuit connected to each of the asynchronous DRAM macros by in internal input/output (I/O) bus and controlled by the interface conversion circuit to provide synchronous burst of data through frequency conversion.

2. The quasi-synchronous DRAM circuit recited in claim 1 wherein the interface conversion circuit controls the memory banks independently of one another using separate control signals.

3. The quasi-synchronous DRAM circuit recited in claim 1 wherein the interface conversion circuit and the data buffer circuit are optionally disabled to use the quasi-synchronous DRAM circuit as a conventional asynchronous DRAM circuit.

4. The quasi-synchronous DRAM circuit recited in claim 1 wherein the data buffer circuit comprises high-speed bidirectional circuits, including off-chip drivers for transferring data from the DRAM macros to I/O pads and input buffers for transferring data from the I/O pads to the DRAM macros.

5. The quasi-synchronous DRAM circuit recited in claim 4 wherein the data buffer circuit further includes high-speed bus and multiplexer circuits for transferring data between the DRAM macros and the off-chip drivers and input buffers, the multiplexer circuits being controlled by the interface conversion circuit.

6. The quasi-synchronous DRAM circuit recited in claim 5 wherein the interface conversion circuit comprises:

a plurality of input buffer circuits for receiving external control and address signals; and a command decoder connected to receive the external control and address signals and generating separate control signals to independently control the memory banks and control signals for the data buffer circuit.

7. The quasi-synchronous DRAM circuit recited in claim 6 wherein the command decoder comprises:

a state machine implemented in a gate-array design; and combination logic receiving outputs of the state machine and generating the control signals.

8. the quasi-synchronous DRAM circuit recited in claim 7 implemented in a single integrated circuit package.

9. The quasi-synchronous DRAM circuit recited in claim 8 wherein the integrated circuit package includes processor core logic and peripheral circuitry.

10. The quasi-synchronous DRAM circuit recited in claim 7 wherein the DRAM macros are implemented as a plurality of DRAM chips mounted on a memory module and the interface conversion circuit and data buffer circuit are implemented as application specific integrated circuits mounted on the memory module.

\* \* \* \* \*